(12) United States Patent
Sugishita

(10) Patent No.: US 12,341,034 B2
(45) Date of Patent: *Jun. 24, 2025

(54) SHEET PASTING DEVICE AND SHEET PASTING METHOD

(71) Applicant: LINTEC CORPORATION, Tokyo (JP)

(72) Inventor: Yoshiaki Sugishita, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 192 days.

This patent is subject to a terminal disclaimer.

(21) Appl. No.: 18/071,305

(22) Filed: Nov. 29, 2022

(65) Prior Publication Data

US 2023/0122563 A1 Apr. 20, 2023

Related U.S. Application Data

(63) Continuation of application No. PCT/JP2021/020351, filed on May 28, 2021.

(30) Foreign Application Priority Data

Jun. 18, 2020 (JP) ................................. 2020-104963

(51) Int. Cl.
*H01L 21/67* (2006.01)
*B29C 65/00* (2006.01)
(Continued)

(52) U.S. Cl.
CPC .. *H01L 21/67132* (2013.01); *H01L 21/67092* (2013.01); *H01L 21/6836* (2013.01);
(Continued)

(58) Field of Classification Search
CPC ......... H01L 21/67011; H01L 21/67092; H01L 21/6836; B29C 66/345; B29C 66/342;
(Continued)

(56) References Cited

U.S. PATENT DOCUMENTS

2004/0106301 A1* 6/2004 Teshirogi ............ B32B 37/0053
438/778

FOREIGN PATENT DOCUMENTS

JP 2006056528 A 3/2006
JP 2006143234 A 6/2006
(Continued)

OTHER PUBLICATIONS

Office Action (Non-Final Rejection) dated Sep. 25, 2024, issued in related U.S. Appl. No. 18/071,351.
(Continued)

*Primary Examiner* — Carson Gross
(74) *Attorney, Agent, or Firm* — Holtz, Holtz & Volek PC

(57) ABSTRACT

A sheet pasting device EA includes: a sheet feed unit 10 that feeds an adhesive sheet AS; and a press unit 20 that has a press roller 22 for pressing the adhesive sheet AS against a work WK and that pastes the adhesive sheet AS on the work WK by pressing the adhesive sheet AS against the work WK moving relative to the press roller 22, the press unit 20 bringing the press roller 22 into contact with an attachment surface WK1 of the work WK and rotating the press roller 22 on the attachment surface WK1, at a stage before pressing the adhesive sheet AS against the work WK using the press roller 22.

1 Claim, 3 Drawing Sheets

(51) Int. Cl.
  *B32B 37/00* (2006.01)
  *H01L 21/683* (2006.01)
(52) U.S. Cl.
  CPC .......... *B29C 66/342* (2013.01); *B29C 66/345* (2013.01); *B32B 37/0053* (2013.01)
(58) Field of Classification Search
  CPC .............. B29C 63/0047; B32B 37/003; B32B 37/0053
  See application file for complete search history.

(56) References Cited

FOREIGN PATENT DOCUMENTS

| | | | |
|---|---|---|---|
| JP | 2013074106 A | | 4/2013 |
| JP | 2017050373 A | * | 3/2017 |
| JP | 2017059582 A | | 3/2017 |
| WO | 2021256219 A1 | | 12/2021 |

OTHER PUBLICATIONS

International Search Report (ISR) (and English translation thereof) dated Aug. 10, 2021, issued in International Application No. PCT/JP2021/020351.
Written Opinion dated Aug. 10, 2021, issued in International Application PCT/JP2021/020351.
U.S. Appl. No. 18/071,351, First Named Inventor: Yoshiaki Sugishita: Title: "Sheet Pasting Device and Sheet Pasting Method", filed Nov. 29, 2022.
"Taiwanese Office Action (and an English language translation thereof) dated Sep. 10, 2024, issued in counterpart Taiwanese Application No. 110120524".
Japanese Office Action (and an English language translation thereof) dated May 20, 2025, issued in counterpart Japanese Application No. 2022-532453.
Japanese Office Action (and an English language translation thereof) dated May 20, 2025, issued in Japanese Application No. 2022-532454 (which is a counterpart of related U.S. Appl. No. 18/071,351).

* cited by examiner

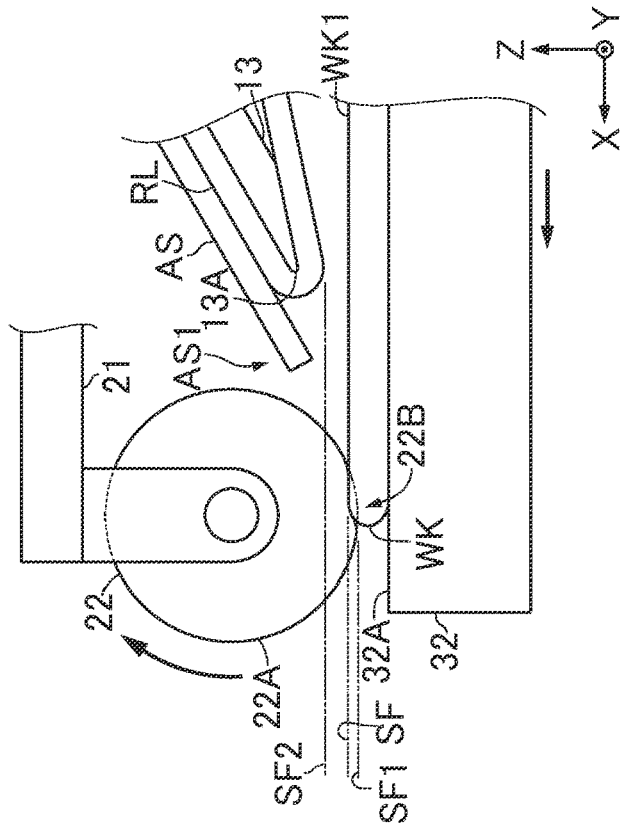

SHEET PASTING DEVICE AND SHEET PASTING METHOD

BACKGROUND OF THE INVENTION

Field of the Invention

The present invention relates to a sheet pasting device and a sheet pasting method, and for example, relates to a device and a method that paste a sheet on a work such as a semiconductor wafer.

Description of the Related Art

A sheet pasting device that pastes an adhesive sheet on a work such as a semiconductor wafer or a ring frame is generally known. In this device, when a sheet feed unit feeds the adhesive sheet, a press roller presses a leading end of the adhesive sheet in terms of a feeding direction (hereinafter, "a leading end of the adhesive sheet in terms of a feeding direction" will be also referred to simply as "a feed leading end") against an attachment surface of the work.

SUMMARY OF THE INVENTION

The present invention disclosed and claimed herein, in one aspect thereof, comprises a sheet pasting device. The device comprises:

a sheet feed unit that feeds an adhesive sheet; and a press unit that has a press roller for pressing the adhesive sheet against a work and that pastes the adhesive sheet on the work by pressing the adhesive sheet against the work moving relative to the press roller, the press unit bringing the press roller into contact with an attachment surface of the work and rotating the press roller on the attachment surface, at a stage before pressing the adhesive sheet against the work using the press roller.

Further scope of applicability of the present invention will become apparent from the detailed description given hereinafter. The detailed description and embodiments are only given as examples though showing preferred embodiments of the present invention, and therefore, from the contents of the following detailed description, changes and modifications of various kinds within the spirits and scope of the invention will become apparent to those skilled in the art.

BRIEF DESCRIPTION OF THE DRAWINGS

The present invention will be fully understood from the following detailed description and the accompanying drawings. The accompanying drawings only show examples and are not intended to restrict the present invention. In the accompanying drawings:

FIG. 1B to FIG. 1E are views to explain the operation of the sheet pasting device.

DETAILED DESCRIPTION

Figure 1A:
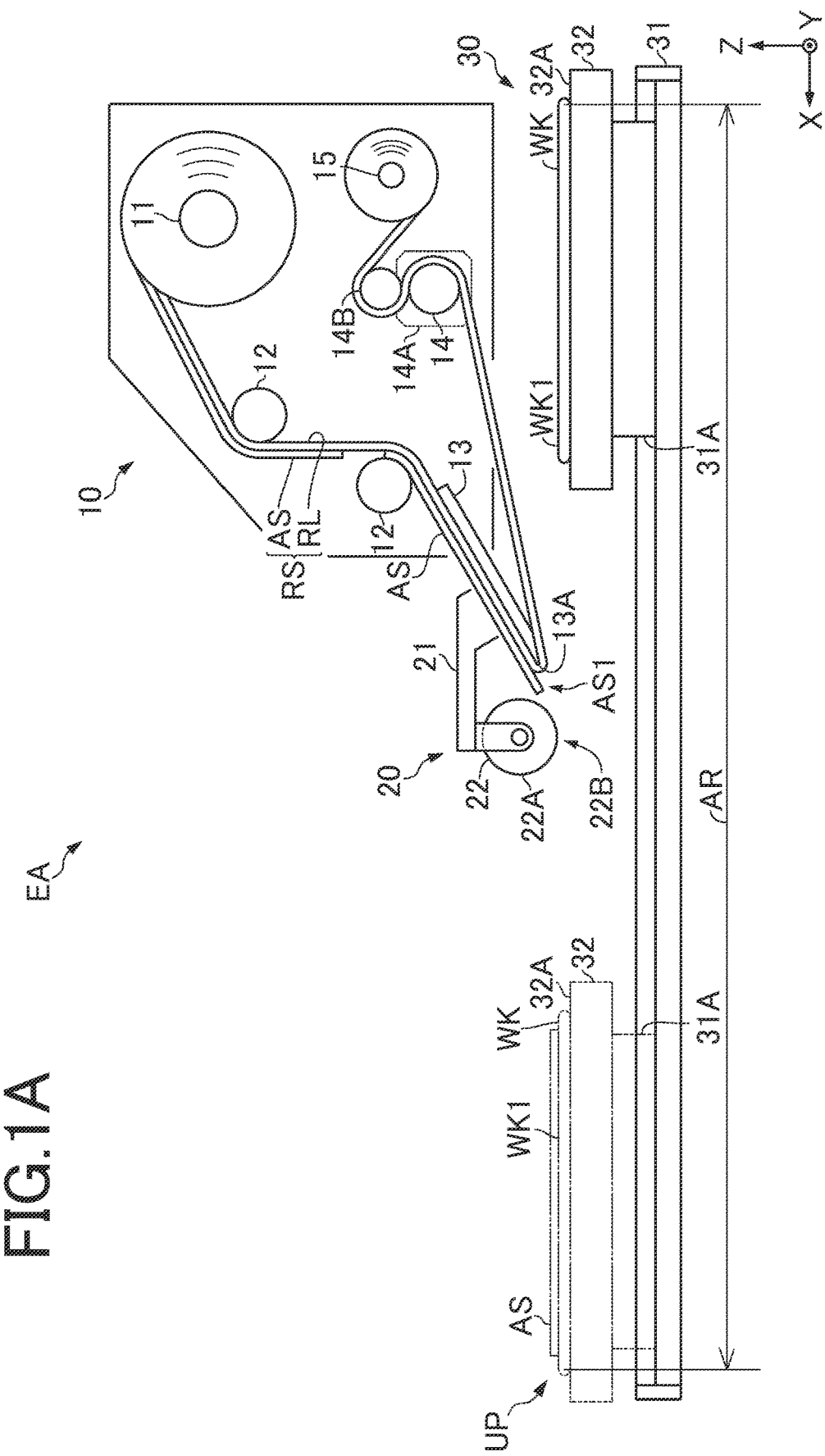
FIG. 1A is an explanatory view of a sheet pasting device according to one embodiment.

An embodiment will be hereinafter described based on the drawings.

It should be noted that X-axis, Y-axis, and Z-axis in this embodiment are orthogonal to one another, where the X-axis and the Y-axis are within a predetermined plane while the Z-axis is orthogonal to the predetermined plane. Further, in this embodiment, FIG. 1 as viewed in the direction from the near side parallel to the Y-axis is used as a reference for direction, and when a direction is mentioned without any designation of a drawing, an "upper" direction means a direction indicated by an arrow along the Z-axis, a "lower" direction means a direction opposite the upper direction, a "left" direction means a direction indicated by an arrow along the X-axis, a "right" direction means a direction opposite the "left" direction, a "front" direction means a direction toward the near side in FIG. 1 in terms of a direction parallel to the Y-axis, and a "rear" direction means a direction opposite the "front" direction.

A sheet pasting device EA includes: a sheet feed unit 10 that feeds an adhesive sheet AS; and a press unit 20 that has a press roller 22 for pressing the adhesive sheet AS against a work WK and that pastes the adhesive sheet AS on the work WK by pressing the adhesive sheet AS against the work WK moving relative to the press roller 22. The sheet pasting device EA is disposed near a work transfer unit 30 that transfers the work WK.

The sheet feed unit 10 is capable of feeding the adhesive sheet AS by releasing the adhesive sheet AS from a release liner RL to which the adhesive sheet AS is temporarily bonded.

Specifically, the sheet feed unit 10 includes: a support roller 11 that supports a raw sheet RS in which the adhesive sheets AS are temporarily bonded to the band-shaped release liner RL; a guide roller 12 that guides the raw sheet RS; a releasing plate 13 as a releasing unit that folds the release liner RL at its releasing edge 13A to release the adhesive sheet AS from the release liner RL; a drive roller 14 that is supported by a not-illustrated output shaft of a rotary motor 14A as a drive device and sandwiches the release liner RL between itself and a pinch roller 14B; and a recovering roller 15 as a recovering unit that is supported by an output shaft of a not-illustrated drive device, constantly applies a predetermined tension to the release liner RL present between itself and the pinch roller 14B, during the automatic operation of the sheet pasting device EA, and recovers the release liner RL.

The press unit 20 includes a bracket 21 supported by the releasing plate 13 and a press roller 22 that is rotatably supported by the bracket 21 and presses the adhesive sheet AS against the work WK with its pressing surface 22A. At a stage before pressing the adhesive sheet AS against the work WK using the press roller 22, the press unit 20 brings the press roller 22 into contact with an attachment surface WK1 of the work WK and rotates the press roller 22 on the attachment surface WK1.

The press roller 22 of this embodiment deforms by coming into contact with the work WK.

The work transfer unit 30 includes a support table 32 supported by a slider 31A of a linear motor 31 as a drive device and having a holding surface 32A that is capable of suction-holding owing to a not-illustrated pressure-reducing unit (holding unit) such as a pressure-reducing pump or a vacuum ejector.

As illustrated in FIG. 1B, in the above-described sheet pasting device EA, the work WK is moved with its attachment surface WK1 being within a predetermined movement plane SF, and the movement plane SF is between a first plane SF1 and a second plane SF1, the first plane being parallel to the movement plane SF and coming into contact with the press roller 22 at a position closest to the movement plane SF, and the second plane SF2 being parallel to the movement plane SF and coming into contact with the release liner RL at a position closest to the movement plane SF, within a movement range AR where the attachment surface WK1 moves. A contact portion 22B, of the press roller 22, that comes into contact with the attachment surface WK1 deforms between the first plane SF1 and the second plane SF2, and the press roller 22 rotates on the attachment surface WK1.

Further, the contact portion 22B of the press roller 22 deforms between the first plane SF1 and a third plane SF3 parallel to the movement plane SF and more apart from the movement plane SF side than the second plane SF2 by the thickness of the adhesive sheet AS, and the press roller 22 presses the adhesive sheet AS against the work WK to paste the adhesive sheet AS thereon.

The operation of the above-described sheet pasting device EA will be described.

First, a user of the sheet pasting device EA (hereinafter, referred to simply as a "user") sets the raw sheet RS as illustrated in FIG. 1A in the sheet pasting device EA in which its members are arranged at the initial positions indicated by the solid lines in FIG. 1A, and then inputs an automatic operation start signal through a not-illustrated operation unit such as an operation panel or a personal computer. In response, the sheet feed unit 10 drives the rotary motor 14A to send out the raw sheet RS, and when the sending-direction leading end of the top adhesive sheet AS is released by a predetermined length at the releasing edge 13A of the releasing plate 13, the sheet feed unit 10 stops driving the rotary motor 14A. Next, when the user or a not-illustrated transfer unit such as a multi-joint robot or a belt conveyor places the work WK on the support table 32, the work transfer unit 30 drives the not-illustrated pressure-reducing unit to start the suction-holding of the work WK on the support surface 32A Thereafter, when the work transfer unit 30 drives the linear motor 31 to move the support table 32 leftward, the work WK comes into contact with the press roller 22, and the press roller 22 in contact with the work WK deforms and rotates on the attachment surface WK1 as the work WK moves, as illustrated in FIG. 1C. At this time, as illustrated in FIG. 1C, the press roller 22 deforms between the first plane SF1 and the second plane SF2 and rotates on the attachment surface WK1. Next, when the work WK reaches a predetermined position with respect to the sheet feed unit 10, the sheet feed unit 10 drives the rotary motor 14A to send out the raw sheet RS at the same speed as the transfer speed of the work WK and releases the adhesive sheet AS from the release liner RL by the releasing plate 13 to feed the adhesive sheet AS.

Figure 1D:
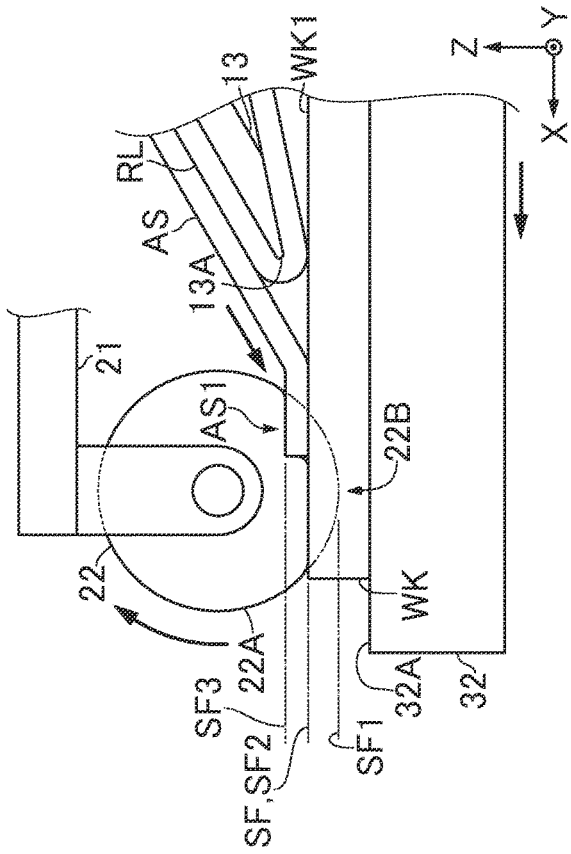

Then, as illustrated in FIG. 1D, the adhesive sheet AS fed by the sheet feed unit 10 is pressed by the press roller 22 to be pasted on the work WK. At this time, as illustrated in FIG. 1D, the press roller 22 deforms between the first plane SF1 and the third plane SF3 because its deformation amount increases by the thickness of the adhesive sheet AS, and rotates on the adhesive sheet AS. Next, when the top adhesive sheet AS is entirely pasted on the work WK, so that a united product UP is formed, and the feeding-direction leading end of an adhesive sheet AS next to the top adhesive sheet AS is released by a predetermined length at the releasing edge 13A of the releasing plate 13, the sheet feed unit 10 stops driving the rotary motor 14A. Thereafter, when the united product UP reaches a predetermined position on the left of the press roller 22, the work transfer unit 30 stops driving the linear motor 31 to stop the leftward movement of the support table 32, and thereafter stops driving the not-illustrated pressure-reducing unit to cancel the suction-holding of the work WK on the support surface 32A. Next, when the user or the not-illustrated transfer unit transfers the united product UP to the next step, the work transfer unit 30 drives the linear motor 31 to return the support table 32 to the initial position. Thereafter the same operation as above is repeated.

According to the above-described embodiment, even if the feed leading end AS1 comes into contact with the press roller 22, the advancement of the adhesive sheet AS is not temporarily hindered because the press roller 22 is rotating. This prevents wrinkles and bubbles from being formed in the feed leading end AS1 of the adhesive sheet AS pasted on the work WK.

The invention is by no means limited to the above units and processes as long as the above operations, functions, or processes of the units and processes are achievable, still less to the above merely exemplary structures and processes described in the exemplary embodiment. For instance, the sheet feed unit may be any as long as it is capable of feeding the adhesive sheet, and is by no means limited as long as it is within the technical scope in view of the common general technical knowledge at the time of the filing of the application (the same applies to the other units and steps).

The sheet feed unit 10 may send out a raw sheet in which cuts in a closed-loop shape or all along the short width direction are formed in a band-shaped adhesive sheet base temporarily bonded to a release liner RL and predetermined regions demarcated by the cuts are adhesive sheets AS, to feed the adhesive sheet AS, or the sheet feed unit 10 may employ a raw sheet in which a band-shaped adhesive sheet base is temporarily bonded to a release liner RL, and form cuts in a closed-loop shape or all along the short width direction in the adhesive sheet base by a cutting unit to set predetermined regions demarcated by the cuts as adhesive sheets AS. The sheet feed unit 10 may feed a band-shaped adhesive sheet. When releasing the adhesive sheet AS from the release liner RL, the sheet feed unit 10 may perform the torque control of the rotary motor 14A so that a predetermined tension is applied to the raw sheet RS. The raw sheet RS or the release liner RL may be supported or guided by a plate-shaped member, a shaft member, or the like instead of a roller such as the support roller 11 or the guide roller 12. The raw sheet RS may be supported in, for example, a fan-folded state instead of in a rolled-up state, to be drawn out. The sheet feed unit 10 may employ a recovering unit that recovers the release liner RL in a fan-folded state, a state of being cut into small pieces by a shredder or the like, or a state of being simply piled up, or the sheet feed unit 10 without the recovering unit can also be employed. The sheet feed unit 10 may feed the adhesive sheet AS while moving itself without or with the support table 32 being moved. The sheet feed unit 10 may send out the adhesive sheet AS to which the release liner RL is not temporarily bonded, to feed the adhesive sheet AS.

In this embodiment, when feeding the adhesive sheet AS, the sheet feed unit 10 sends out the raw sheet RS at the same speed as the transfer speed of the work WK, but may send out the raw sheet RS at a higher speed than the transfer speed of the work WK or may send out the raw sheet RS at a lower speed than the transfer speed of the work WK, within a range allowing the pasting of the adhesive sheet AS on the work WK without the formation of wrinkles and bubbles in the feed leading end AS1.

The press unit 20 may be configured such that the press roller 22 does not come into contact with the holding surface 32A or may be configured such that the press roller 22 comes into contact with the holding surface 32A and rotates on the holding surface 32A. The press roller 22 may elastically deform or plastically deform by coming into contact with the work WK, or the press roller 22 may be configured not to deform by coming into contact with the holding surface 32A, the work WK, or the adhesive sheet AS. In this embodiment, while the work WK is moved relative to the press roller 22 whose position is not changed, the press unit 20 pastes the adhesive sheet AS on the work WK by pressing the adhesive sheet AS against the work WK moving relative to the press roller 22, but while moving the press roller 22 without or with the work WK being moved, the press unit 20 may paste the adhesive sheet AS on the work WK by pressing the adhesive sheet AS against the work WK moving relative to the press roller 22. The press roller 22 may be a press roller 22 in a brush shape that pastes the adhesive sheet AS on the work WK by pressing the adhesive sheet AS against the work WK, using its brush-shaped member. The material of the press roller 22 may be rubber, resin, sponge, metal, or the like.

In the case where the work WK is a semiconductor wafer and a ring frame, the press roller 22 preferably has a Young's modulus of 100 MPa to 2000 MPa.

[Reason for Setting Lower Limit Value]

When in the sheet pasting device EA, a rubber roller with a 100 MPa Young's modulus was used as the press roller 22, an object to be united in which a semiconductor wafer is disposed in an opening of a ring frame was used as the work WK, and the adhesive sheet AS was pressed against the object to be united to be pasted thereon, no bubbles were formed between the object to be united and the adhesive sheet AS, nor did the adhesive sheet AS wrinkle, and thus the pasting of the adhesive sheet AS succeeded favorably. Incidentally, when a polyethylene roller with a 700 MPa Young's modulus was used as the press roller 22 and the same pasting as above was performed, the pasting of the adhesive sheet AS succeeded favorably as in the above.

On the other hand, when in the sheet pasting device EA, a polyurethane foam roller with a 60 MPa Young's modulus was used as the press roller 22 and the adhesive sheet AS was pressed against the aforesaid object to be united to be pasted thereon, because of the insufficient force to press the adhesive sheet AS, bubbles were formed between the object to be united and the adhesive sheet AS, or the adhesive sheet AS wrinkled, and thus the pasting of the adhesive sheet AS did not succeed favorably. Incidentally, when a rubber roller with a 40 MPa Young's modulus was used as the press roller 22 and the same pasting as above was performed, the pasting did not succeed favorably as in the above.

The above-described phenomena occurred also when the work WK was only a ring frame and when the work WK was only a semiconductor wafer.

[Reason for Setting Upper Limit Value]

When in the sheet pasting device EA, a polyester roller with a 2000 MPa Young's modulus was used as the press roller 22 and the adhesive sheet AS was pressed against the aforesaid object to be united to be pasted thereon, no bubbles were formed between the object to be united and the adhesive sheet AS, nor did the adhesive sheet AS wrinkle, and thus the pasting of the adhesive sheet AS succeeded favorably. When an acrylic roller with a 1600 Young's modulus was used as the press roller 22 and the same pasting as above was performed, the pasting of the adhesive sheet AS succeeded favorably as in the above.

On the other hand, when in the sheet pasting device EA, an epoxy roller with a 2600 MPa Young's modulus was used as the press roller 22 and the adhesive sheet AS was pressed against the aforesaid object to be united to be pasted thereon, with only a small difference in the degree of parallelization between an adhesive sheet pasting surface of the object to be united and a pressing portion of the press roller 22, bubbles were formed between the object to be united and the adhesive sheet AS or the adhesive sheet AS wrinkled, and thus the pasting of the adhesive sheet AS did not succeed favorably. Further, the ring frame was distorted or the semiconductor wafer suffered damage such as cracking or chipping. Incidentally, when a polystyrene roller with a 3000 MPa Young's modulus was used as the press roller 22 and the same pasting as above was performed, the pasting did not succeed favorably as in the above, the ring frame was distorted, or the semiconductor wafer suffered damage such as cracking and chipping.

The above phenomena also occurred when the work WK was only a ring frame and when the work WK was only a semiconductor wafer.

The work transfer unit 30 may employ a drive device that moves the support table 32 in the front-rear direction so that the work WK can move not only in the left-right direction but also in the front-rear direction within a work area of each unit. The work transfer unit 30 may be included in the sheet pasting device EA or may be a unit not included therein.

The sheet pasting device EA may be one that uses a semiconductor wafer as the work WK and pastes a protect sheet on a circuit surface of the semiconductor wafer, may be one that uses a ring frame as the work WK and pastes the adhesive sheet AS on the ring frame, or may be one that uses a semiconductor wafer and a ring frame as the work WK and pastes the adhesive sheet AS on the semiconductor wafer and the ring frame to unite them. In these cases, the adhesive sheet AS may be one having a shape along the shape of the semiconductor wafer or the shape of the ring frame.

Figure 1E:
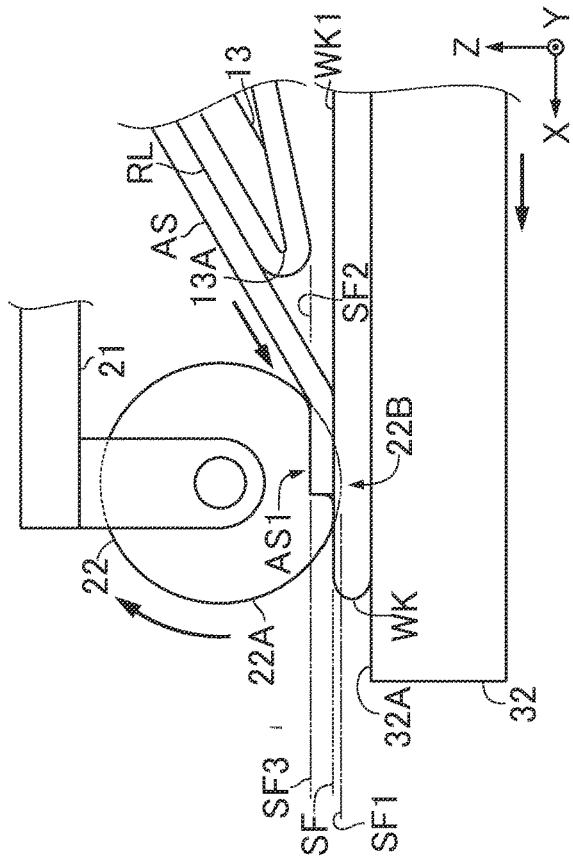

As illustrated in FIG. 1E, the thickness of the work WK allowing the pasting by the sheet pasting device EA is largest when the movement plane SF is at the same position as the second plane SF2.

The materials, types, shapes, and so on of the adhesive sheet AS and the work WK in the present invention are not limited. For example, the adhesive sheet AS and the work WK may be in a circular shape, an elliptical shape, a polygonal shape such as a triangular shape or a quadrangular shape, or any other shape. The adhesive sheet AS may be of a pressure-sensitive bonding type, a heat-sensitive bonding type, or the like. If the adhesive sheet AS is of the heat-sensitive bonding type, it may be bonded by an appropriate method, for example, by an appropriate heating unit for heating the adhesive sheet AS, such as a coil heater or a heating side of a heat pipe. Further, such an adhesive sheet AS may be, for example, a single-layer adhesive sheet having only an adhesive layer, an adhesive sheet having an intermediate layer between a base and an adhesive layer, a three or more-layer adhesive sheet having a cover layer on the upper surface of a base, or an adhesive sheet such as what is called a double-faced adhesive sheet in which a base is releasable from an adhesive layer. The double-faced adhesive sheet may be one having one intermediate layer or more, may be a single-layer one or a multilayer one not having an intermediate layer. Further, the work WK may be, for example, a simple item such as food, a resin container, a semiconductor wafer such as a silicon semiconductor wafer or a compound semiconductor wafer, a circuit board, an information recording substrate such as an optical disk, a glass plate, a steel sheet, pottery, a wood board, or a resin, or may be a composite made up of two of these or more, and it may also be a member, an article, or the like of any form. The adhesive sheet AS may be read as one indicating its function or application, and may be, for example, any sheet, film, tape, or the like such as an information entry label, a decoration label, a protect sheet, a dicing tape, a die attach film, a die bonding tape, or a recording layer forming resin sheet The drive devices in the above-described embodiment each may be an electric machine such as a rotary motor, a direct-acting motor, a linear motor, a uniaxial robot, or a multi-joint robot having biaxial or triaxial or more joints, may be an actuator such as an air cylinder, a hydraulic cylinder, a rodless cylinder, or a rotary cylinder, or may be any other drive device. One in which some of these are directly or indirectly combined can also be employed.

In the above-described embodiment, in the case where a rotating member such as a roller is employed, a drive device that drives the rotation of the rotating member may be provided, and the surface of the rotating member or the rotating member itself may be formed of a deformable member such as rubber or resin or the surface of the rotating member or the rotating member itself may be formed of a non-deformable member. Another member that rotates or does not rotate, such as a shaft or a blade, may be employed instead of the roller. In the case where one that presses an object to be pressed, such as a press unit or a press member such as a press roller or a press head, is employed, a member such as a roller, a round bar, a blade member, rubber, resin, or sponge may be employed or a structure that sprays gaseous substance such as the atmospheric air or gas fir pressing may be employed, instead of or in addition to those exemplified in the above, and the one that presses may be formed of a deformable member such as rubber or resin or may be formed of a non-deformable member. In the case where one that releases an object to be released, such as a releasing unit or a releasing member such as a releasing plate or a releasing roller, is employed, a member such as a plate-shaped member, a round bar, or a roller may be employed instead of or in addition to those exemplified above, and the one that releases may be formed of a deformable member such as rubber or resin or may be formed of a non-deformable member. In the case where one that supports (holds) a member to be supported (member to be held), such as a support (holding) unit or a support (holding) member, is employed, the member to be supported may be supported (held) by a gripping unit such as a mechanical chuck or a chuck cylinder, Coulomb force, an adhesive (adhesive sheet, adhesive tape), a tackiness agent (tacky sheet, tacky tape), magnetic force, Bernoulli suction, suction attraction, a drive device, or the like. In the case where one that cuts a member to be cut or that forms a cut or a cutting line in a member to be cut, such as a cutting unit or a cutting member, is employed, one that cuts using a cutter blade, a laser cutter, ion beams, thermal power, heat, water pressure, a heating wire, or the spraying of gas, liquid, or the like may be employed instead of or in addition to those exemplified above, and at the time of the cutting, an appropriate combination of drive devices may move the one that cuts the object to be cut.

What is claimed is:

1. A sheet pasting device comprising:
a sheet feed unit that feeds an adhesive sheet; and
a press unit that has a press roller for pressing the adhesive sheet against a work and that pastes the adhesive sheet on the work by pressing the adhesive sheet against the work moving relative to the press roller,
wherein the press unit brings the press roller into contact with an attachment surface of the work and rotates the press roller on the attachment surface, at a stage before pressing the adhesive sheet against the work using the press roller,
wherein the sheet feed unit is capable of feeding the adhesive sheet by releasing the adhesive sheet from a release liner to which the adhesive sheet is temporarily bonded,
wherein the work is moved with the attachment surface being within a predetermined movement plane, and
wherein the movement plane is between a first plane and a second plane, the first plane being parallel to the movement plane and coming into contact with the press roller at a position closest to the movement plane, and the second plane being parallel to the movement plane and coming into contact with the release liner at a position closest to the movement plane, within a movement range where the attachment surface moves, and
wherein a contact portion, of the press roller, that comes into contact with the attachment surface deforms between the first plane and the second plane and the press roller rotates on the attachment surface.

* * * * *